(12) United States Patent  
Petivan et al.

(10) Patent No.: US 9,519,018 B2  
(45) Date of Patent: Dec. 13, 2016

(54) SYSTEMS AND METHODS FOR DETECTING UNAUTHORIZED POPULATION OF SURFACE-MOUNT DEVICES ON A PRINTED CIRCUIT BOARD

(71) Applicant: Dell Products L.P., Round Rock, TX (US)

(72) Inventors: James Lewis Petivan, Austin, TX (US); Alan R. Dellinger, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 230 days.

(21) Appl. No.: 14/284,451

(22) Filed: May 22, 2014

(65) Prior Publication Data

US 2015/0338451 A1    Nov. 26, 2015

(51) Int. Cl.
| | | |
|---|---|---|
| *G01R 31/04* | (2006.01) | |
| *H05K 3/42* | (2006.01) | |
| *H05K 1/02* | (2006.01) | |
| *H05K 1/11* | (2006.01) | |
| *H05K 3/34* | (2006.01) | |

(52) U.S. Cl.
CPC .............. *G01R 31/041* (2013.01); *G01R 31/04* (2013.01); *H05K 1/0275* (2013.01); *H05K 3/42* (2013.01); *H05K 1/0268* (2013.01); *H05K 1/113* (2013.01); *H05K 3/3447* (2013.01); *H05K 2201/10022* (2013.01); *H05K 2201/10151* (2013.01); *H05K 2201/10651* (2013.01); *H05K 2201/10939* (2013.01); *Y10T 29/49156* (2015.01); *Y10T 29/49167* (2015.01)

(58) Field of Classification Search
CPC ... G01R 31/041; G01R 31/046; G01R 1/0408; G01R 31/2808; G01R 31/2818; G01R 31/04; G01R 31/2874; G01R 31/2886; G01R 31/2891; G01R 1/07342; G06F 21/82; G06F 21/83; G06F 21/86
USPC ........ 439/55–85; 324/750.3, 754.01, 754.07, 324/754.08, 756.04, 756.05, 763.01
See application file for complete search history.

(56) References Cited

U.S. PATENT DOCUMENTS

| | | |
|---|---|---|
| 5,877,033 A | 3/1999 | Matern |
| 2014/0041060 A1* | 2/2014 | Selwood ................ G06F 21/83 726/34 |

* cited by examiner

*Primary Examiner* — Julian Huffman  
*Assistant Examiner* — Michael Konczal  
(74) *Attorney, Agent, or Firm* — Jackson Walker L.L.P.

(57) ABSTRACT

In accordance with embodiments of the present disclosure, a circuit board may include a connector configured to electrically couple a device to the circuit board. The connector may include a conductive element configured to be electrically coupled to a first voltage and a detection pad configured to be electrically coupled to a second voltage via a resistor, such that when a device pin of a device is electrically coupled to the conductive element, the detection pad is electrically coupled to the conductive element via the device pin.

24 Claims, 3 Drawing Sheets

SYSTEMS AND METHODS FOR DETECTING UNAUTHORIZED POPULATION OF SURFACE-MOUNT DEVICES ON A PRINTED CIRCUIT BOARD

TECHNICAL FIELD

The present disclosure relates in general to information handling systems, and more particularly to a system and method for detecting unauthorized population of surface-mount devices on a printed circuit board.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more circuit boards operable to mechanically support and electrically couple electronic components making up the information handling system. For example, circuit boards may be used as part of motherboards, memories, storage devices, storage device controllers, peripherals, peripheral cards, network interface cards, and/or other electronic components. As is known in the art, a circuit board may comprise a plurality of conductive layers separated and supported by layers of insulating material laminated together, with conductive traces disposed on and/or in any of such conductive layers.

Circuit boards often include pads for surface-mount connectors or other devices that are de-populated on production systems intended for an end user. Such devices may include debuggers or verification devices intended to test system functionality (e.g., Joint Test Action Group, Inter-Integrated Circuit, In-Target Probe, and other debugger or verification devices), but not intended to be included with an information handling system provided to an end user. Accordingly, these de-populated pads provide interfaces that may sometimes be used to access or program information handling system components, compromising security of the entire information handling system. For example, an unauthorized party may gain access to and reprogram parts of an information handling system by populating de-populated parts.

SUMMARY

In accordance with the teachings of the present disclosure, the disadvantages and problems associated with securing an information handling system against unauthorized population of surface-mount devices on a printed circuit board may be reduced or eliminated.

In accordance with embodiments of the present disclosure, a circuit board may include a connector configured to electrically couple a device to the circuit board. The connector may include a conductive element configured to be electrically coupled to a first voltage and a detection pad configured to be electrically coupled to a second voltage via a resistor, such that when a device pin of a device is electrically coupled to the conductive element, the detection pad is electrically coupled to the conductive element via the device pin.

In accordance with these and other embodiments of the present disclosure, a method may include forming a conductive element configured to be electrically coupled to a first voltage and forming a detection pad configured to be electrically coupled to a second voltage via a resistor, such that when a device pin of a device is electrically coupled to the conductive element, the detection pad is electrically coupled to the conductive element via the device pin.

In accordance with these and other embodiments of the present disclosure, an information handling system may include a processor, one or more information handling resources, and a circuit board configured to communicatively couple the one or more information handling resources to the processor. The circuit board may include a connector configured to electrically couple a device to the circuit board. The connector may include a conductive element configured to be electrically coupled to a first voltage and a detection pad configured to be electrically coupled to a second voltage via a resistor, such that when a device pin of a device is electrically coupled to the conductive element, the detection pad is electrically coupled to the conductive element via the device pin.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 3:
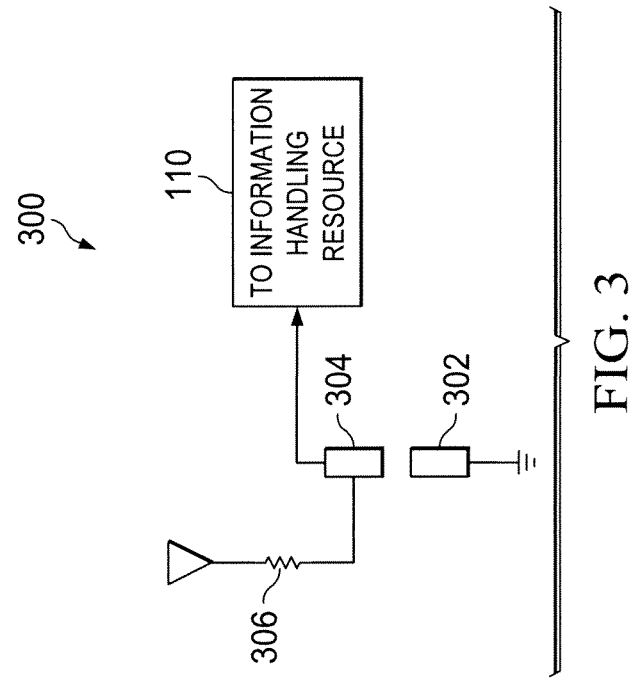
FIG. 3 illustrates a block diagram of an example detection circuit for detecting unauthorized population of a surface-mount device on a circuit board, in accordance with embodiments of the present disclosure.

Preferred embodiments and their advantages are best understood by reference to FIGS. 1 through 4C, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

As discussed above, an information handling system may include one or more circuit boards operable to mechanically support and electrically connect electronic components making up the information handling system (e.g., packaged integrated circuits). Circuit boards may be used as part of motherboards, memories, storage devices, storage device controllers, peripherals, peripheral cards, network interface cards, and/or other electronic components. As used herein, the term "circuit board" includes printed circuit boards (PCBs), printed wiring boards (PWBs), etched wiring boards, and/or any other board or similar physical structure operable to mechanically support and electrically couple electronic components.

Figure 1:
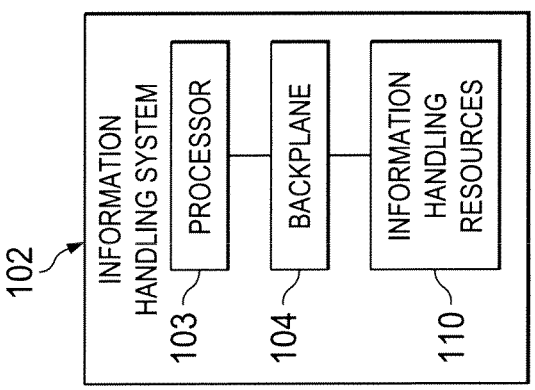
FIG. 1 illustrates a block diagram of selected components of an example information handling system, in accordance with embodiments of the present disclosure.

FIG. 1 illustrates a block diagram of selected components of an example information handling system 102, in accordance with embodiments of the present disclosure. In some embodiments, information handling system 102 may comprise a server. In other embodiments, information handling system 102 may comprise a personal computer, such as a laptop, notebook, or desktop computer. In other embodiments, information handling system 102 may be a mobile device sized and shaped to be readily transported and carried on a person of a user of information handling system 102 (e.g., a smart phone, a tablet computing device, a handheld computing device, a personal digital assistant, etc.). As depicted in FIG. 1, information handling system 102 may include a processor 103 and one or more information handling resources 110 coupled to processor 103 via a backplane 104.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Backplane 104 may comprise any system, device, or apparatus configured to interconnect processor 103 and the one or more information handling resources, and may comprise a motherboard and/or one or more other circuit boards.

Generally speaking, information handling resources 110 may include any component system, device or apparatus of information handling system 100, including without limitation processors, buses, computer-readable media, input-output devices and/or interfaces, storage resources, network interfaces, motherboards, electro-mechanical devices (e.g., fans), displays, and/or power supplies.

Figure 2:
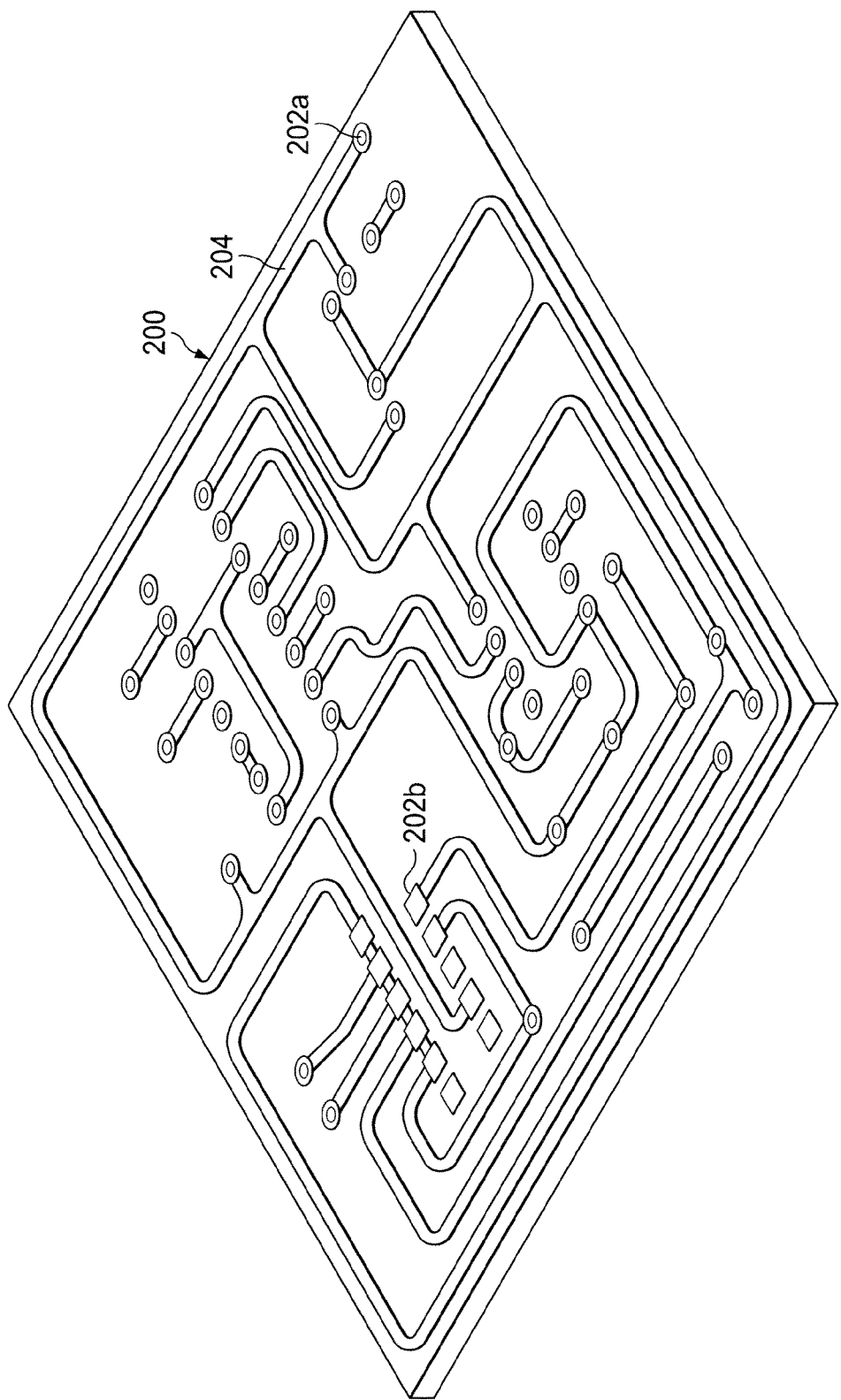
FIG. 2 illustrates an example circuit board that may be used in an information handling system, in accordance with embodiments of the present disclosure.

FIG. 2 illustrates an example circuit board 200 that may be used in information handling system 102, in accordance with embodiments of the present disclosure. As depicted in FIG. 1, circuit board 200 may include a plurality of pads 202 (e.g., pads 202a and 202b) and traces 204. Pads 202 may comprise a conductive material and may be formed on a surface of circuit board 200. Further, each pad 202 may be operable to receive a pin of an electronic component (e.g., a packaged integrated circuit or other information handling resource 110) and provide electrical connectivity between the pin and one or more traces 204. Traces 204 may comprise a conductive material and may be formed on a surface of circuit board 200, or in a layer of circuit board 200 not visible from the surface thereof. Further, each trace 204 may be operable to provide conductive pathways between electronic components mounted to pads 202. As used herein, the term "conductive element" may refer to pads 202, traces 204, and/or any other element disposed on, in, and/or within circuit board 200 that is operable to provide an electrically conductive pathway (e.g., vias). The various pads 202, traces 204, and vias may comprise silver, copper, aluminum, lead, nickel, other metals, metal alloys, and/or any other conductive material that may readily conduct electrical current.

As shown in FIG. 2, a circuit board 200 may employ different types of pads 202. For example, a circuit board 200 may include one or more through-hole pads 202a which include a hole or opening in the pad 202a to receive a pin of an electronic component through the hole. As another example, a circuit board 200 may include a plate-like pad 202b comprising a plate of conductive material formed on a surface of circuit board 200 and configured to receive a corresponding pin of an electronic component.

Although FIG. 2 depicts conductive elements 202 and 204 on the top surface of circuit board 200, it is understood that conductive elements 202 and 204 may also be disposed on the bottom surface of circuit board 200. In addition, circuit board 200 may comprise a plurality of conductive layers separated and supported by layers of insulating material laminated together, and traces 204 may be disposed on and/or in any of such conductive layers. Connectivity between conductive elements disposed on and/or in various layers of circuit board 200 may be provided by conductive vias.

FIG. 3 illustrates a block diagram of an example detection circuit 300 for detecting unauthorized population of a surface-mount device on a circuit board 200, in accordance with embodiments of the present disclosure. As shown in FIG. 3, detection circuit 300 may comprise a rail pad 302, a detection pad 304, and a pull-up resistor 306.

Rail pad 302 may comprise a circuit board pad (e.g., a pad 202) and may be coupled to a ground voltage. Detection pad 304 may comprise a circuit board pad (e.g., a pad 202) and may be coupled to a source voltage via a resistor 306. Detection pad 304 may also be communicatively coupled to an information handling resource 110. Rail pad 302 and detection pad 304 may be formed sufficiently proximate to each other such that when a person attempts to electrically couple a device pin of an electronic component to rail pad 302, the device pin also electrically couples to detection pad 304, thus electrically coupling rail pad 302 to detection pad 304 via the device pin.

Resistor 306 may include a passive two-terminal electrical component wherein the current through resistor 306 is substantially in direct proportion to the voltage across the terminals of resistor 306, in accordance with Ohm's law.

In operation, when a device pin of an electronic component is not electrically coupled to rail pad 302, a voltage on detection pad 304 will be approximately equal to the source voltage coupled to resistor 306. On the other hand, when a device pin of an electronic component is electrically coupled to rail pad 302, such device pin may electrically couple detection pad 304 to a ground voltage via the device pin and rail pad 302. Thus, the voltage present on detection pad 304 may indicate whether a device pin is coupled to rail pad 302.

The voltage of detection pad 304 may be communicated to an information handling resource 110. When the voltage of detection pad 304 indicates that a device pin is coupled to rail pad 302, information handling resource 110 may store information of such event in a computer-readable medium (e.g., non-volatile memory) integral to or accessible to the information handling resource 110, so that the event is logged, even if the electronic component having the device pin is later removed. The information stored by the information handling resource 110 regarding the event may thus indicate to a user that an unauthorized population of circuit board 200 may have occurred.

Figure 4A:
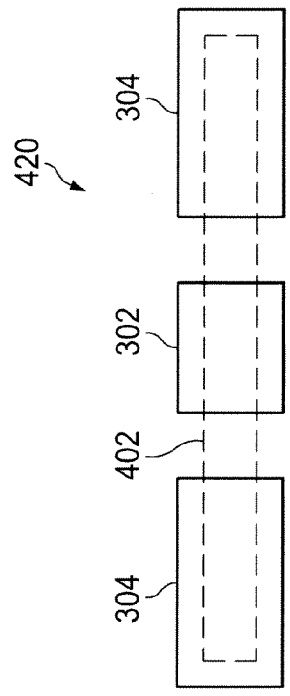
FIGS. 4A-4C each illustrate a configuration of pads that may be used in connection with a circuit for detecting unauthorized population of a surface-mount device on a circuit board, in accordance with embodiments of the present disclosure.
Figure 4B:
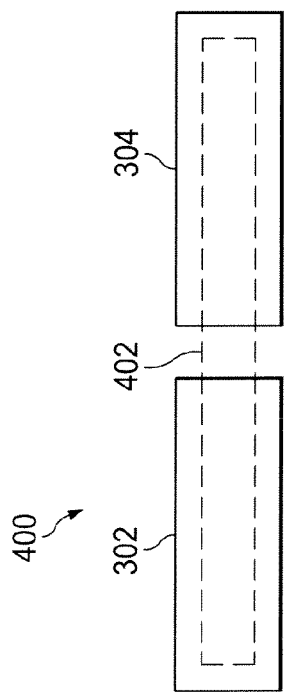
Figure 4C:
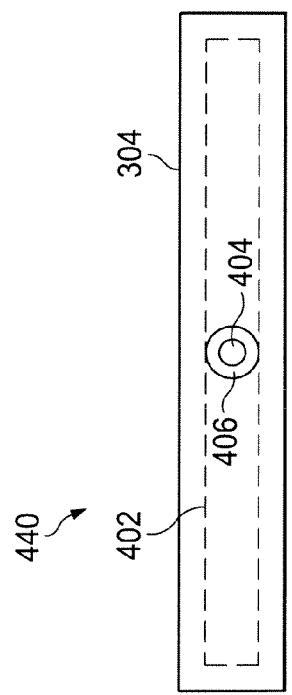

FIGS. 4A-4C each illustrate a configuration of pads that may be used in connection with a circuit for detecting unauthorized population of a surface-mount device on a circuit board 200, in accordance with embodiments of the present disclosure. FIG. 4A depicts a pad configuration 400 including a single rail pad 302 and single detection pad 304. As shown in FIG. 4A, when a device pin 402 is coupled to rail pad 302, detection pad 304 may be coupled to rail pad 302 via device pin 402.

FIG. 4B depicts a pad configuration 420 including a single rail pad 302 and multiple detection pads 304. As shown in FIG. 4B, when a device pin 402 is coupled to rail pad 302, one or more of detection pads 304 may be coupled to rail pad 302 via device pin 402. As pads rail pads 302 and detection pads 304 may be larger than their corresponding device pins 402 to account for placement tolerance, there may be some space in which a device pin 402 may be moved from a side of a pad 302/304. The existence of two or more detection pads 304 in pad configuration may avoid a placement in which a device pin 402 may be shifted in a direction away from a detection pad 304. In pad configuration 420, detection signals from the multiple detection pads 304 (e.g., voltages) may combine into a single detection signal en route to an information handling resource 110.

FIG. 4C depicts a pad configuration 440 including a detection pad 304 surrounding a ground via 404, with a gap 406 between detection pad 304 and ground via 404. As shown in FIG. 4C, when a device pin 402 is coupled to ground via 402, one or more of detection pads 304 may be coupled to ground via 404 via device pin 402.

In these and other configurations, rail pads 302, detection pads 304, and ground vias 404 may be of any suitable sizes and/or shapes. In some embodiments, it may be desirable to configure rail pads 302/ground vias 404 and detection pads 304 (e.g., in an interlocking pattern) so as to render it difficult to tamper with the rail pads 302/ground vias 404 and detection pads 304 in a way so as to disable detection circuit 300.

In addition to configuring rail pads 302/ground vias 404 and detection pads 304 to avoid tampering, detection circuit 300 may include other features to reduce or prevent tampering. For example, in some embodiments, information handling resource 110 may include an internal pull-down resistor, wherein such internal pull-down resistor is coupled between detection pad 304 and ground. With such an internal pull-down resistor, information handling resource 110 may detect and log a cut in the trace coupling detection pad 304 and information handling resource 110 and/or the removal of resistor 306.

In addition or alternatively, resistor 306 may be physically placed significantly more proximate to detection pad 304 than to information handling resource 110. If resistor 306 were placed proximate to information handling resource 110, an intruder could cut the trace coupling detection pad 304 and information handling resource 110, practically rendering detection circuit 300 useless. However, by placing resistor 306 proximate to detection pad 304, an intruder may not be able to cut the trace coupling detection pad 304 and information handling resource 110 with also decoupling resistor 306 from information handling resource 110, thus further allowing information handling resource 110 to detect and log a cut in such trace.

In some embodiments, multiple rail pads 302/ground vias 404 of a circuit board connection may each have one or more corresponding detection pads 304, and detection signals from the multiple detection pads 304 (e.g., voltages) may combine into a single detection signal en route to an information handling resource 110.

In the various embodiments of detection circuit 300 described above, rail pad 302 is shown as being coupled to a ground voltage while resistor 306 is coupled to a source voltage. However, similar functionality and operation of detection circuit 300 may be achieved in embodiments in which rail pad 302 is coupled to a source voltage and resistor 306 is coupled to a ground voltage. In such embodiments, information handling resource 110 may include an internal pull-up resistor coupled between the source voltage an detection pad 304. In such embodiments, coupling of a device to rail pad 302 may cause a voltage on the trace coupling detection pad 304 and information handling resource 110 to rise from the ground voltage to the source voltage to indicate potentially unauthorized population of a device on a circuit board.

Although the present disclosure has been described in detail, it should be understood that various changes, substitutions, and alterations can be made hereto without departing from the spirit and the scope of the disclosure as defined by the appended claims.

What is claimed is:

1. A circuit board, comprising a connector configured to electrically couple a device to the circuit board, the connector comprising:
    a conductive element configured to be electrically coupled to a first voltage; and
    a detection pad configured to be electrically coupled to a second voltage via a resistor, such that:
        when a device pin of a device is electrically coupled to the conductive element, the detection pad is electrically coupled to the conductive element via the device pin; and
        when the detection pad is not electrically coupled to the conductive element, a voltage of the detection is approximately equal to the second voltage wherein approximately zero current flows through the resistor.

2. The circuit board of claim 1, wherein the conductive element comprises a pad.

3. The circuit board of claim 1, wherein the conductive element comprises a via.

4. The circuit board of claim 1, wherein a voltage of the detection pad is indicative of whether the device pin is electrically coupled to the conductive element.

5. The circuit board of claim 4, wherein the detection pad is configured to communicate the voltage of the detection pad to an information handling resource communicatively coupled to the detection pad.

6. The circuit board of claim 5, wherein the information handling resource is configured to, based on the voltage of the detection pad, record information indicative of whether the device pin is electrically coupled to the conductive element.

7. The circuit board of claim 1, the connector further comprising a second detection pad configured to be electrically coupled to the second voltage via the resistor or a second resistor, such that when a device pin of a device is electrically coupled to the conductive element, the second detection pad is electrically coupled to the conductive element via the device pin.

8. The circuit board of claim 1, the connector further comprising:
    a second conductive element configured to be electrically coupled to the first voltage; and
    a second detection pad configured to be electrically coupled to the second voltage via the resistor or a second resistor, such that when a second device pin of the device is electrically coupled to the conductive element, the second detection pad is electrically coupled to the second conductive element via the second device pin.

9. A method, comprising:
    forming a conductive element configured to be electrically coupled to a first voltage; and
    forming a detection pad configured to be electrically coupled to a second voltage via a resistor, such that:
        when a device pin of a device is electrically coupled to the conductive element, the detection pad is electrically coupled to the conductive element via the device pin; and
        when the detection pad is not electrically coupled to the conductive element, a voltage of the detection is approximately equal to the second voltage wherein approximately zero current flows through the detection pad.

10. The method of claim 9, wherein the conductive element comprises a pad.

11. The method of claim 9, wherein the conductive element comprises a via.

12. The method of claim 9, wherein a voltage of the detection pad is indicative of whether the device pin is electrically coupled to the conductive element.

13. The method of claim 12, wherein the detection pad is configured to communicate the voltage of the detection pad to an information handling resource communicatively coupled to the detection pad.

14. The method of claim 13, wherein the information handling resource is configured to, based on the voltage of the detection pad, record information indicative of whether the device pin is electrically coupled to the conductive element.

15. The method of claim 9, further comprising forming a second detection pad configured to be electrically coupled to the second voltage via the resistor or a second resistor, such that when a device pin of a device is electrically coupled to the conductive element, the second detection pad is electrically coupled to the conductive element via the device pin.

16. The method of claim 9, further comprising:
    forming a second conductive element configured to be electrically coupled to the first voltage; and
    forming a second detection pad configured to be electrically coupled to the second voltage via the resistor or a second resistor, such that:
        when a second device pin of the device is electrically coupled to the conductive element, the second detection pad is electrically coupled to the second conductive element via the second device pin.

17. An information handling system comprising:
    a processor;
    one or more information handling resources; and
    a circuit board configured to communicatively couple the one or more information handling resources to the processor, the circuit board comprising a connector, wherein the connector comprises:
        a conductive element configured to be electrically coupled to a first voltage; and
        a detection pad configured to be electrically coupled to a second voltage via a resistor, such that:
            when a device pin of a device is electrically coupled to the conductive element, the detection pad is electrically coupled to the conductive element via the device pin; and
            when the detection pad is not electrically coupled to the conductive element, a voltage of the detection is approximately equal to the second voltage wherein approximately zero current flows through the detection pad.

18. The information handling system of claim 17, wherein the conductive element comprises a pad.

19. The information handling system of claim 17, wherein the conductive element comprises a via.

20. The information handling system of claim 17, wherein a voltage of the detection pad is indicative of whether the device pin is electrically coupled to the conductive element.

21. The information handling system of claim 20, wherein the detection pad is configured to communicate the voltage of the detection pad to an information handling resource communicatively coupled to the detection pad.

22. The information handling system of claim 21, wherein the information handling resource is configured to, based on the voltage of the detection pad, record information indicative of whether the device pin is electrically coupled to the conductive element.

23. The information handling system of claim 17, the connector further comprising a second detection pad configured to be electrically coupled to the second voltage via the resistor or a second resistor, such that when a device pin of a device is electrically coupled to the conductive element, the second detection pad is electrically coupled to the conductive element via the device pin.

24. The information handling system of claim 17, the connector further comprising:
- a second conductive element configured to be electrically coupled to the first voltage; and
- a second detection pad configured to be electrically coupled to the second voltage via the resistor or a second resistor, such that when a second device pin of the device is electrically coupled to the conductive element, the second detection pad is electrically coupled to the second conductive element via the second device pin.

* * * * *

UNITED STATES PATENT AND TRADEMARK OFFICE
CERTIFICATE OF CORRECTION

| | |
|---|---|
| PATENT NO. | : 9,519,018 B2 |
| APPLICATION NO. | : 14/284451 |
| DATED | : December 13, 2016 |
| INVENTOR(S) | : James Lewis Petivan et al. |

It is certified that error appears in the above-identified patent and that said Letters Patent is hereby corrected as shown below:

In the Claims

Please amend Claim 1 as follows:

1. A circuit board, comprising a connector configured to electrically couple a device to the circuit board, the connector comprising:
    a conductive element configured to be electrically coupled to a first voltage; and
    a detection pad configured to be electrically coupled to a second voltage via a resistor, such that:
    when a device pin of a device is electrically coupled to the conductive element, the detection pad is electrically coupled to the conductive element via the device pin; and
    when the detection pad is not electrically coupled to the conductive element, a voltage of the detection pad is approximately equal to the second voltage wherein approximately zero current flows through the resistor.

Please amend Claim 9 as follows:

9. A method, comprising:
    forming a conductive element configured to be electrically coupled to a first voltage; and
    forming a detection pad configured to be electrically coupled to a second voltage via a resistor, such that:
    when a device pin of a device is electrically coupled to the conductive element, the detection pad is electrically coupled to the conductive element via the device pin; and
    when the detection pad is not electrically coupled to the conductive element, a voltage of the detection pad is approximately equal to the second voltage wherein approximately zero current flows through the detection pad.

Signed and Sealed this
Eighteenth Day of April, 2017

Michelle K. Lee
*Director of the United States Patent and Trademark Office*

CERTIFICATE OF CORRECTION (continued)
U.S. Pat. No. 9,519,018 B2

Please amend Claim 17 as follows:

17. An information handling system comprising:
 a processor;
 one or more information handling resources; and
 a circuit board configured to communicatively couple the one or more information handling resources to the processor, the circuit board comprising a connector, wherein the connector comprises:
 a conductive element configured to be electrically coupled to a first voltage; and
 a detection pad configured to be electrically coupled to a second voltage via a resistor, such that:
 when a device pin of a device is electrically coupled to the conducive element, the detection pad is electrically coupled to the conductive element via the device pin; and
 when the detection pad is not electrically coupled to the conductive element, a voltage of the detection pad is approximately equal to the second voltage wherein approximately zero current flows through the detection pad.